United States Patent [19]

Hosemann

[11] 3,999,022
[45] Dec. 21, 1976

[54] ELECTRICAL BRUSH SENSOR APPARATUS USEFUL FOR ANALOG-TO-DIGITAL CONVERTERS

[75] Inventor: John Henry Hosemann, Cheyenne, Wyo.

[73] Assignee: Ideal Aerosmith, Inc., Cheyenne, Wyo.

[22] Filed: Sept. 13, 1974

[21] Appl. No.: 505,670

Related U.S. Application Data

[60] Continuation of Ser. No. 347,872, April 4, 1973, abandoned, which is a division of Ser. No. 190,137, Oct. 18, 1971, Pat. No. 3,754,239.

[52] U.S. Cl. .............................. 200/23; 307/223 R; 307/247 A; 310/247
[51] Int. Cl.$^2$ ................. H01H 19/00; H03K 17/56; H01R 39/00; H02K 13/00
[58] Field of Search ................ 200/8 R, 11 R, 11 J, 200/11 K, 23–26, 243, 257, 260, 275, 277; 310/247; 307/223 R, 233 A, 223 B, 247 A

[56] References Cited

UNITED STATES PATENTS

| | | | |
|---|---|---|---|
| 2,008,053 | 7/1935 | Whiteside | 200/11 J UX |
| 2,264,998 | 12/1941 | Miner, Jr. | 310/247 |
| 2,675,448 | 4/1954 | Knudson | 200/257 |
| 2,948,795 | 8/1960 | Brinster et al. | 200/11 J X |
| 3,043,922 | 7/1962 | Laviana et al. | 200/11 J X |
| 3,146,322 | 8/1964 | Farrell | 200/23 |
| 3,437,766 | 4/1969 | Ahrens | 200/11 X |
| 3,445,705 | 5/1969 | Fuller et al. | 310/247 |
| 3,505,549 | 4/1970 | Wacek | 310/247 |

*Primary Examiner*—James R. Scott
*Attorney, Agent, or Firm*—John E. Reilly; Earl C. Hancock

[57] ABSTRACT

An analog-to-digital converter or encoder utilizes a combination of a standard photoelectric encoder and improved slow-friction long-lasting brush-type encoder which together with the necessary code conversion circuitry will produce an absolute unambiguous decimal digital readout and a visual display of the readout all contained in a single compact housing which can be mounted in direct association to the object being measured. The encoder circuit also has an internal clutch arrangement whereby the encoder systems can be selectively disconnected from the input to allow the encoder to remain at zero or some other reference point while the relative positions of the encoder and the object whose position is being measured are changed. The unambiguous output is generated by sensing the position of the first order, or least significant readout digit and utilizing the position to selectively control energization of a preselected one of a pair of sensors associated with the next higher order digit both in the same encoder system and between the systems.

5 Claims, 13 Drawing Figures

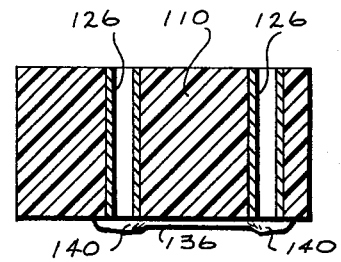
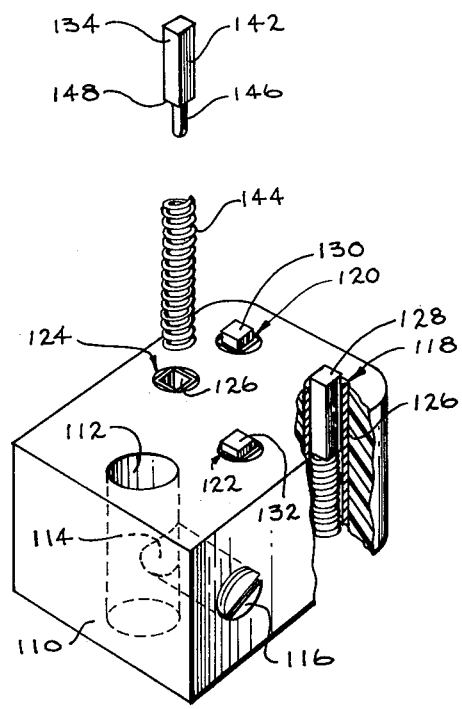
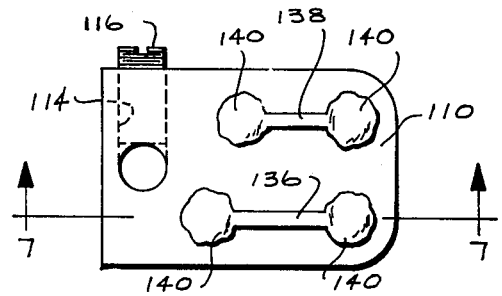
FIG. 7.
FIG. 5.
FIG. 6.
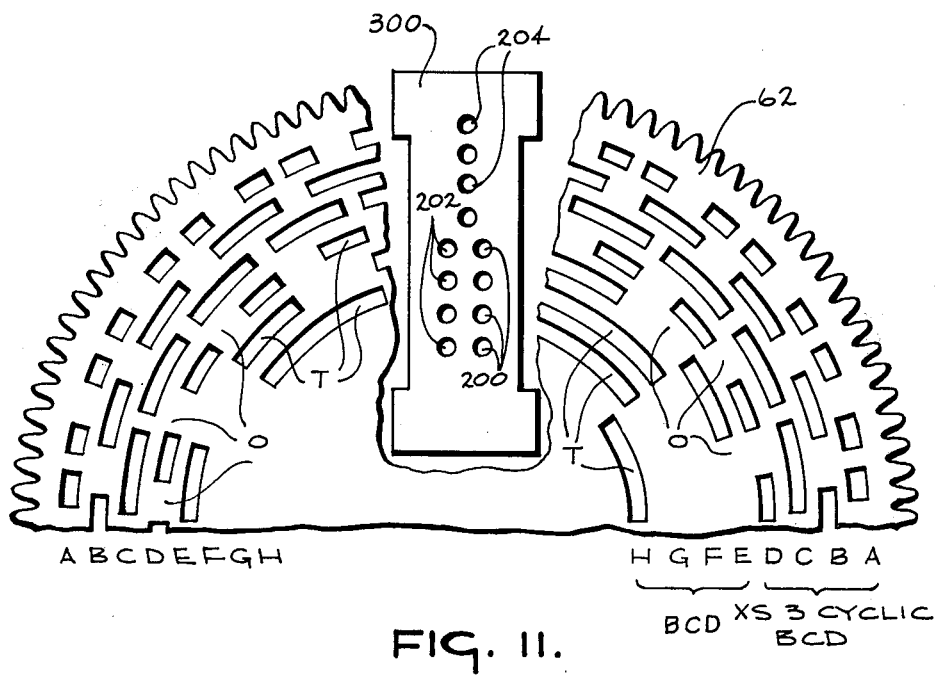
FIG. 11.

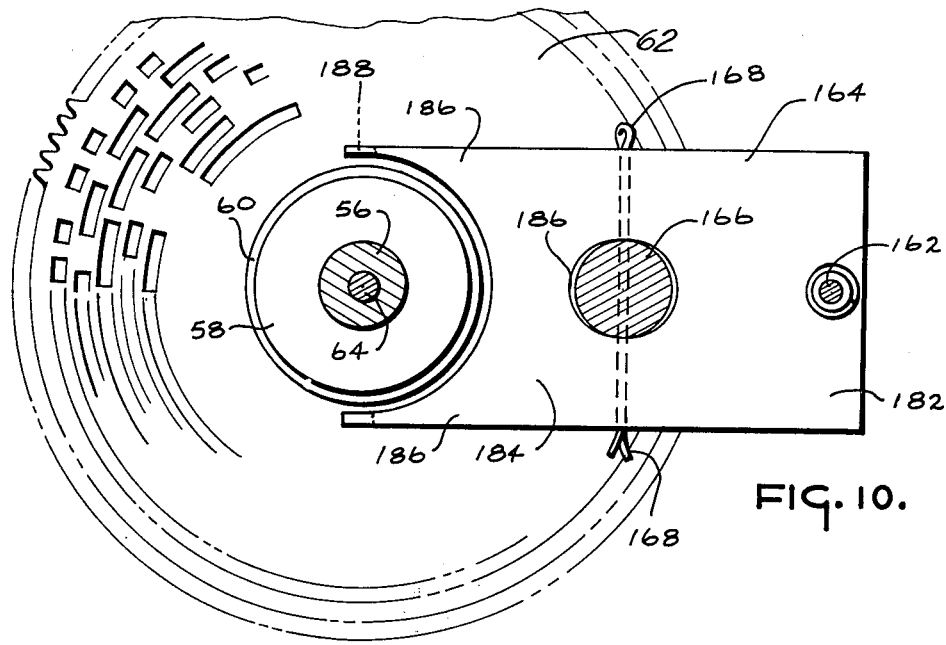
FIG. 10.
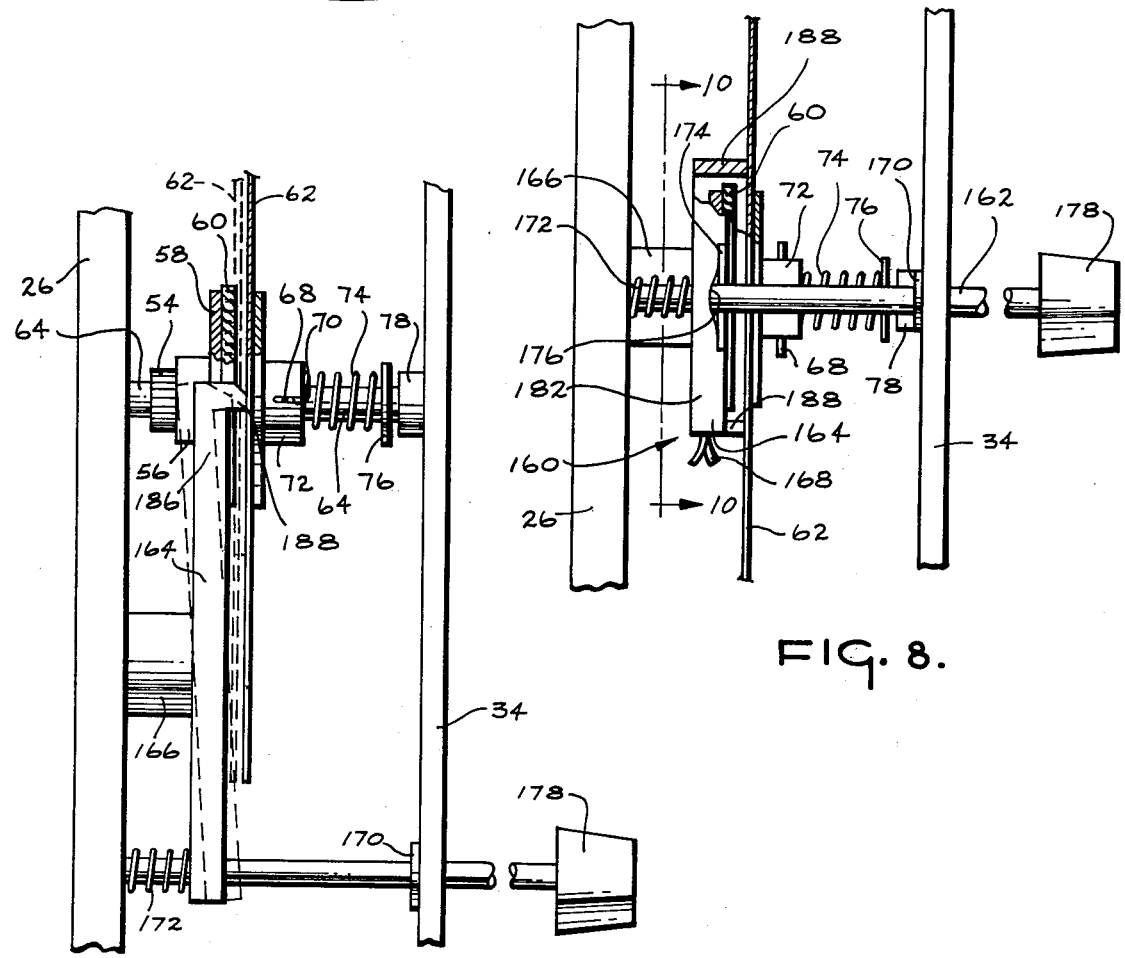
FIG. 8.
FIG. 9.

ELECTRICAL BRUSH SENSOR APPARATUS USEFUL FOR ANALOG-TO-DIGITAL CONVERTERS

This is a continuation of previously copending but now abandoned application Ser. No. 347,872, filed Apr. 4, 1973, a division of application Ser. No. 190,137, filed Oct. 18, 1971, now U.S. Pat. No. 3,754,239.

This invention relates generally to analog-to-digital converters and more particularly to a new and improved encoder or shaft position digitizer with a self-contained, absolute decimal digital readout system particularly adapted for use in measuring and displaying distance of travel or position of a working tool relative to a work table or other work piece supporting device.

Encoders or shaft position digitizers which are used in measuring the distance of travel of a working tool relative to a work table commonly utilize a rack and pinion connection between the encoder and the working tool or work table whichever is to move relative to the encoder. In an encoder employing an absolute system, wherein each increment of resolution through the full range of travel is a discrete position, it is difficult to electronically "zero" the encoder at any desired position. Therefore, it has become common practice in the use of prior art encoders to first "zero" the encoder by shifting the relative position of the work table and working tool until the encoder reads zero, then to mechanically disengage the rack and pinion so that the relative positions of the working tool and work table can be changed and a new starting point established. This type of mechanical disengagement frequently calls for a cumbersome apparatus which adds to the expense that must be met before the usefulness of the encoder is entirely satisfactory.

Prior art encoders also have been characterized by having at least two physically separate units, in addition to a power source, interconnected by electrical wiring to provide the desired digitized output. Typically, encoders, be they photoelectric or brush-type, have a power source in one housing, the encoding circuitry in another housing, and the digitized visual readout in still another housing. It is readily apparent that such an arrangement is both cumbersome and inconvenient.

The encoder of the present invention is a hybrid encoder employing both photoelectric and brush-type sensors mounted in cooperative relation in a single housing to provide a digitized readout in the same housing. The photoelectric sensors are disposed to sense coded tracks on a disc which is operably connected to an analog input which may take the form of a revolvable shaft being connected to the coded disc by speed multiplication means. The speed multiplication is such that the photoelectric sensors are desirably adapted to provide absolute binary coded electrical signals that are converted by a logic circuit into corresponding decimalized signals for reception by display means representing the least significant digits in the digital output. The brush-type sensors are operably connected to the coded disc by speed reduction means which may take the form of a gear train with a preselected speed reduction whereby decimal coded signals generated by the brush sensors are desirably adapted to provide absolute decimalized signals for reception by display means representing the most significant digits in the digital output.

A unique finger operated clutch arrangement is provided in the encoder whereby the coded disc and the brush-type sensors may be operably disengaged from the analog input so that the encoder can be "zeroed" and the working tool and work table moved to a new location without losing "zero" and without mechanically disengaging the rack and pinion connection. It will be appreciated that such an arrangement not only eliminates the expense of a separate apparatus for mechanically disengaging the rack and pinion but also provides a convenient and simple way for accomplishing an end that heretofore has been undesirably burdensome.

The encoder of the present invention is also unique in that being hybrid it benefits from the accuracy of a photoelectric encoder in generating the least significant readout digits and the reliability of a brush-type encoder for the most significant digits. The components of each encoder system are interconnected in a common drive train having a predetermined speed reduction between systems whereby the photoelectric components associated with the least significant digits which have the greatest rate of change are driven at a faster speed than the brush-contact components associated with the most significant and thus less frequently changing digits.

The encoder provides an unambiguous readout in every digit. The first or least significant digit is initially coded in a cyclic binary code which inherently produces an unambiguous output. Each successive digit, which is generated by pairs of sensors that are advanced and retarded relative to the associated relatively movable coded elements, is electrically linked to the previous digit whereby the parity of each digit sensing element selects the sensor of the pair of sensors associated with the next digit in a manner such that no ambiguity arises as the pairs of sensors pass from one number to the next. This relation even exists between the adjacent digits that are generated from the separate encoder systems.

Accordingly, it is an object of the present invention to provide a hybrid encoder incorporating both photoelectric and brush-type sensors to convert an analog input into a visual digital output.

It is another object of the present invention to provide a hybrid encoder incorporating both photoelectric and brush-type sensors which produces an unambiguous output by relating the parity of a lower order digit output to the next adjacent higher order digit output in a manner such that a preselected one of a pair of sensors associated with the higher order digit is energized.

It is another object of the present invention to provide a new and improved relatively inexpensive encoder having the encoding components and the visual readout display in a single compact housing.

It is still another object of the present invention to provide an encoder with a built-in disengaging clutch whereby the digital output from the encoder is internally disconnected from the analog input so that the encoder can be moved relative to a working tool without effecting the readout of the encoder.

Other objects, advantages and capabilities of the present invention will become more apparent as the description proceeds taken in conjunction with the accompanying drawings, in which:

FIG. 5 is a perspective view with parts broken away of a pick-up head used in the encoder of FIG. 1 with one of the brush contacts removed for better illustration;

FIG. 6 is a bottom plan view of the pick-up head of FIG. 5;

FIG. 7 is a section taken along lines 7—7 of FIG. 6;

FIG. 8 is an enlarged fragmentary diagrammatic front elevation of the encoder of FIG. 1 showing the clutch assembly;

FIG. 9 is an enlarged fragmentary diagrammatic top plan view of the encoder of FIG. 1 showing the clutch assembly;

FIG. 10 is a section taken along lines 10—10 of FIG. 8 showing the clutch plate;

FIG. 11 is an enlarged fragmentary diagrammatic side elevation with parts broken away of the code disc and part of the photoelectric system used in the encoder of FIG. 1;

As is well known to those familiar with the art, analog-to-digital converters or encoders have a multitude of useful applications such as, for instance, in measuring relative movement of a machine tool or work piece which is mounted on a movable work table associated with the machine tool. As a setting for the present disclosure, the encoder 20 of the present invention is specifically adapted for use in such application and is illustrated as being fixedly mounted adjacent the work table of a machine tool so that an input pinion gear 22 on the encoder meshes with a rack 24 fixedly mounted on one side of the work table whereby linear movement of the work table in the direction of the longitudinal axis of the rack will produce a rotational movement of the pinion gear. It will be appreciated that by utilizing two such encoders, which are operatively connected to the work table on perpendicular sides thereof, the position of the work table along two mutually perpendicular axes can be measured and recorded. It is well known to those skilled in the art that various other ways of operatively connecting the encoder are available to obtain the same result; for example, the encoders may be fixed on perpendicular sides of the work table and the racks fixed adjacent to the work table.

Figure 1:
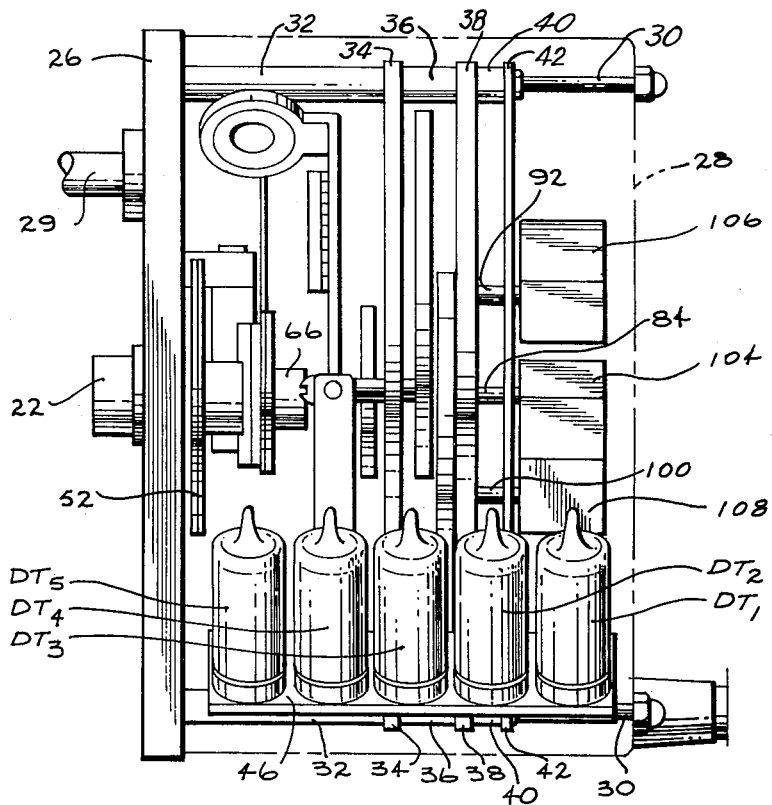
FIG. 1 is a diagrammatic plan view of the encoder of the present invention with the cover removed for better illustration.
Figure 2:
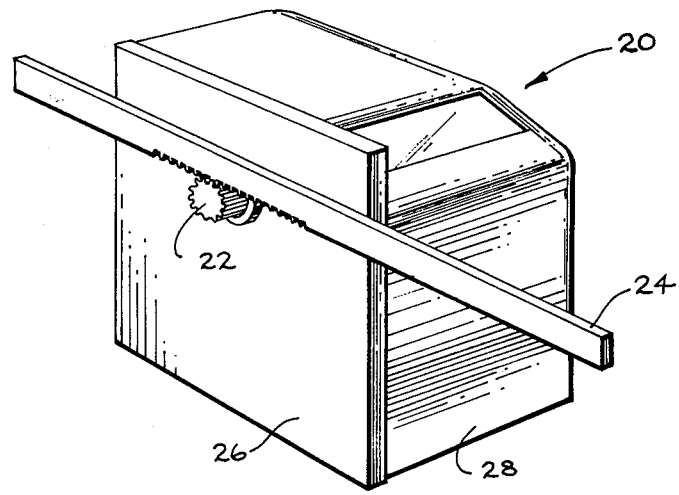
FIG. 2 is a perspective view of the encoder of FIG. 1 showing the rack and pinion connection used to operatively connect the encoder to a relatively movable work table.

Referring now to FIGS. 1 and 2, the encoder 20 of the present invention includes a base plate 26 upon which the working components and electrical logic circuitry of the encoder are mounted and a cover 28 which is attachable to the base plate 26 to enclose the working components and logic circuitry. A power line 29 leading to any suitable power source (not shown) passes through the base 26 whereby it can be suitably connected to the electrical components of the encoder. The base plate is substantially square and has four normally extending support bolts 30 near each of its corners. The support bolts 30 pass through openings in the base plate and have first spacer collars 32 concentrically mounted thereon in abutting relationship to the base plate. A first mounting plate 34 is positioned on the four supporting bolts so as to lie in abutting relationship with the other ends of the spacer collars 32. A second set of spacer collars 36 is concentrically mounted on the support bolts 30 adjacent to the outer side of the first mounting plate 34. A second mounting plate 38 is disposed on the four supporting bolts 30 in abutting relationship to the outer end of the second spacer collars 36 and a third set of spacer collars 40 is concentrically mounted on the support bolts so as to space and separate a first circuit board 42, also received on the support bolts, from the second mounting plate 38.

The encoder 20 is a hybrid encoder which utilizes two separate encoding systems: The first is a photoelectric encoding system, and the second is a brush-type encoding system, which systems cooperate to convert the angular position of the input pinion gear 22 into a five digit decimal readout in five conventional display tubes $DT_1$, $DT_2$, $DT_3$, $DT_4$ and $DT_5$ mounted on a support plate 46 which is secured to the first circuit board 42. The display tubes $DT_1$-$DT_5$ are commercially available electronic items commonly called Nixie tubes and are provided with ten separate input terminals (not shown), each associated with each of the decimal digits 0 through 9, inclusive. When one of the input lines receives a potential, a wire inside the tube, formed in the shape of the associated decimal digit, is illuminated whereby an observer can read the digit through the glass tube enclosure.

Figure 12:
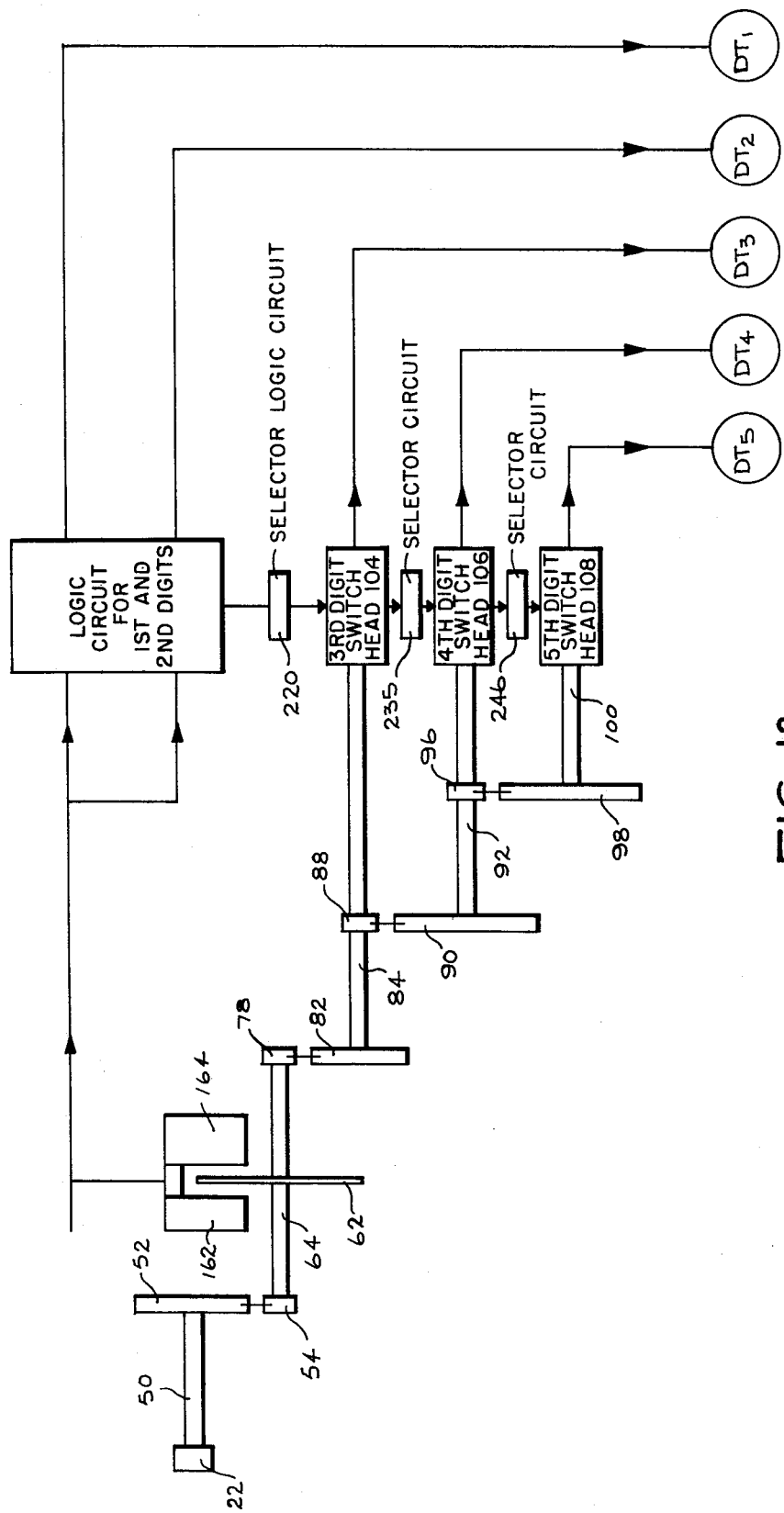
FIG. 12 is a schematic diagram of the mechanical working components and the logic circuitry of the encoder of FIG. 1.

The mechanical components of the photoelectric encoder system and the brush-type encoder system are cooperatively connected through a common spur gear train 48 (FIGS. 3 and 12) which is driven by the input pinion gear 22. As will be explained more clearly hereinafter, the photoelectric encoder system is utilized to produce the two last significant readout digits as displayed by display tubes $DT_1$ and $DT_2$ and the brush-type encoder system is utilized to produce the three most significant digits as displayed by the display tubes $DT_3$, $DT_4$, and $DT_5$. It will be apparent that the first digit, i.e., the digit displayed by display tube $DT_1$, will change at a more rapid rate than the second, the second at a more rapid rate than the third, and so on through all five digits. Therefore, the gear train is effective to rotate the gear train components associated with the photoelectric system at a faster rate than those associated with the brush-type system.

The photoelectric system that is utilized to produce the two least significant digits includes a code disc (to be described in more detail later) that in the disclosed embodiment has a resolution of 200 discrete positions or increments per 360° of rotation, which increments are coded 00 to 99 in 180° and then repeated in the second 180° of the disc. The size of the pinion gear 22 and the speed multiplication through gears operatively connecting the pinion gear to the code disc yield a linear resolution of 0.001 inches of motion which means that the least significant readout digit changes one number for each 0.001 inches of movement of the rack 24 relative to the encoder and for 1/200 of a revolution of the code disc. The brush contacts utilized to produce the three most significant digits are connected to the code disc by gear elements such that there is a successive speed reduction of the brush contacts for the third, fourth and fifth digits (as will be explained later) such that the third digit brush makes 1/10th of a revolution for each one-half of a revolution of the code disc, the fourth digit brush makes one-tenth of a revolution for each complete revolution of the third digit brush, and the fifth digit brush makes one-tenth of a revolution for each full revolution of the fourth digit brush.

Figure 3:
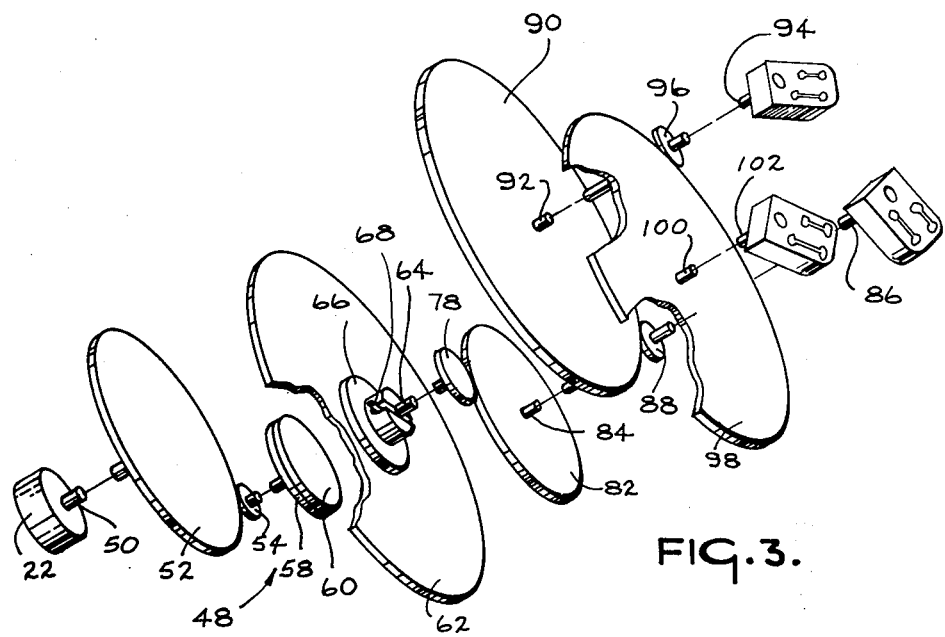
FIG. 3 is a diagrammatic exploded view of the gear train used in the encoder of the present invention shown in FIG. 1.

With specific reference now to the gear train 48, as shown in FIG. 3, and the manner in which it effects the foregoing movement of the encoder components, it will be seen that the input pinion gear 22 is fixed on a first drive shaft 50 which passes through the base plate 26 so that the input gear is on the opposite side of the base plate from the working components of the encoder. The first drive shaft 50 is rotatably journaled in a bearing in the base plate 26 and has a large first drive gear 52 fixed on its end opposite from the input pinion gear 22 so that the first drive gear 52 is on the same side of the base plate as the remainder of the working components of the encoder. For the purpose of illustration the first drive gear 52 has 90 circumferentially spaced teeth and is disposed to mesh with a smaller first driven gear 54 having twelve teeth so that the gear ratio between the gear 52 and the first driven gear 54 is 7.5:1 and the gear 54 is therefore rotated at a rate of 7.5 revolutions to one revolution of the input pinion gear 22. The first driven gear 54 is integrally connected with the hub portion 56 of a drive plate 58 which has a friction plate 60 permanently affixed thereon. In the disclosed embodiment, the friction plate is a cork washer and in normal operation frictionally engages one face of a code disc 62 which is part of the photoelectric encoder system. As will be explained in more detail later, the code disc 62 is provided with a plurality of circular tracks A, B, C, D, E, 82F, G and H (FIG. 11) having alternating relatively opaque 0 and transparent T segments. The first driven gear 54 and the drive plate 58, as well as the friction plate 60, are rotatably mounted and free-wheeling on a second drive shaft 64 which has one end journaled in a bearing in the base plate 26 and its other end journaled in a bearing in the first mounting plate 34. The code disc 62 is bonded or otherwise permanently secured to a driven plate 66 which is keyed to the second drive shaft 64 by a pin 68 (FIGS. 3, 8 and 9) press-fitted in a radial passage through the second drive shaft 64 and passing through diametrically opposed radial slots 70 (only one being shown) in a hub 72 on the driven plate 66. A coil spring 74 is circumferentially disposed on the second drive shaft so as to be biased against an E-pin 76 attached to the second drive shaft 64 adjacent to a second drive gear 78 fixed on the second drive shaft. In this way, the spring 74 urges the driven plate 66 and the code disc 62 through the driven plate into firm frictional engagement with the friction plate 60 so that the code disc and second drive gear are in normal operation caused to be rotated with the first driven gear 54. The second drive shaft 64 is journaled in bearings in the base plate 26 and the first mounting plate 34 and passes through an opening in a second circuit board 80 which is disposed between the first mounting plate 34 and the coded disc 62 and which supports solid state logic circuitry as will be explained more clearly later. It will be apparent that through the first drive gear 52 and first driven gear 54 the second drive shaft 64 is caused to be rotated during normal use at a rate of 7.5 revolutions to every one revolution of the first drive shaft 50, as was pointed out before with regard to the relative speeds of the driven gear 54 and the input gear 22.

Again for the purpose of illustration, the second drive gear 78 has 16 teeth and meshes with a larger second driven gear 82 having eighty teeth to establish a 5:1 gear ratio therebetween. The second driven gear 82 is fixedly mounted on a third drive shaft 84 which in turn is journaled in bearings in the first and second mounting plates and has an outer free end 86 that passes through an opening in the first circuit board 42. The third drive shaft 84 is, therefore, caused to be rotated at a rate of 1.5 revolutions for every one revolution of the input pinion gear 22, which means that the third drive shaft rotates one-tenth of a revolution for every ½ revolution of the second drive shaft 64 on which the photoelectric code disc is mounted. The third drive shaft 84 has fixed thereon a smaller drive gear 88 with 12 teeth. The third drive gear 88 is on the opposite side of the first mounting plate 34 from the second driven gear 78. The third drive gear meshes with a third driven gear 90 having one hundred and twenty teeth which is fixed on a fourth drive shaft 92 that is also journaled in bearings in the first and second mounting plate and has a free end 94 that extends through the first circuit board 42. Again, the gear reduction in the gear train 48 causes the fourth drive shaft 92 to be rotated at a slower rate than the third drive shaft 84, establishing a 10:1 gear reduction so that the fourth drive shaft makes 0.15 revolutions for every one revolution of the input pinion gear 22. The fourth drive shaft also has a fourth drive gear 96, having 12 teeth, fixedly mounted thereon so that both the fourth drive gear 96 and the third driven gear 90 are disposed between the first and second mounting plates. The fourth drive gear 96 meshes with a fourth driven gear 98, having one hundred twenty teeth, which is fixed on a fifth drive shaft 100 that is also journaled in bearings in the first and second mounting plates and has a free outer end 102 which extends through the first circuit board 42. The fifth drive shaft 100, due to the gear reduction of 10:1 between it and the fourth drive shaft, is caused to rotate the slowest of all the drive shafts in the gear train. Specifically, the fifth drive shaft only makes 0.015 revolutions for each one revolution of the input pinion gear.

It will, therefore, be evident that rotation of the input pinion gear 22 will effect rotation of each of the drive and driven gears in the gear train 48 in a manner such that the code disc 62 will rotate at a faster rate than the input pinion gear, and each successive drive shaft will be caused to rotate at preselected slower rates to give the desired rate of change in the respective digits of the five-digit readout.

The third, fourth and fifth drive shafts have fixed on their outer ends, adjacent the outside face of the first circuit board, pick-up heads 104, 106 and 108, respectively, carrying brush contacts to be described in more detail later. The function of the brush contacts is to energize preselected circuits for conveying desired signals to the three most significant readout digits visually displayed by the three display tubes $DT_3$, $DT_4$ and $DT_5$. Again, the two least significant digits, as displayed on the display tubes $DT_1$ and $DT_2$, are obtained from the photoelectric encoder system.

Each of the pick-up heads 104, 106 and 108 is identical and can be seen in FIGS. 5–7 to include an insulating block 110 which is provided with a throughbore 112 adapted to receive in tight-fitting relation one of the drive shafts 84, 92 or 100. A threaded opening 114 communicating at right angles with the throughbore 112 receives a set screw 116 which can be screwed tightly into engagement with the drive shaft in the throughbore to fixedly position the insulating block on the drive shaft. Each insulating block is provided with four parallel brush-receiving openings 118, 120, 122 and 124 passing therethrough in predetermined, closely spaced relation to one another. Each of the brush-receiving openings is also parallel to the throughbore 112 and is provided with a lining 126 of any suitable electrically conductive material which extends from one end of the opening to the other. The conductive lining has a square cross-section for a purpose to be set forth hereinafter. Two of the brush-receiving openings 118 and 120 are spaced equal distances from the throughbore 112 in side-by-side relationship and are located adjacent the opposite end of the insulating block 110 from the throughbore 112. These openings are adapted to receive leading and lagging contact brushes 128 and 130, respectively. The remaining two brush-receiving openings 122 and 124 are adapted to receive grounding brushes 132 and 134 associated respectively with the leading and lagging brushes 128 and 130. The outermost end of the lining for the leading brush is electrically connected by a lead 136 to the outermost end of the lining and its associated grounding brush, and the outermost end of the lining for the lagging brush is electrically connected by a lead 138 to the outermost end of the lining of its associated grounding brush. It can be seen in FIG. 7 that the connectors or leads 136 and 138 form a cover or cap 140 at the end of each brush-receiving opening for a purpose to be explained hereinafter.

The brushes for the openings in each switch are identical and can be seen in FIG. 5 to include a shank portion 142 of a conductive material and a coil spring 144 also of conductive material fixed to the shank portion in axially aligned relation. The shank portion is preferably of a material which is long wearing and has a low coefficient of friction, such as carbon. The shank portion is square in cross-section to mate with the square lining in the brush-receiving openings, and has a reduced end 146 of circular cross-section on which one end of the coil spring 144 is snugly placed. The juncture of the square and round segments of the shank portion defines an abutment shoulder 148 against which the aforementioned one end of the coil spring 144 abuts. When disposed in the brush openings of the switch blocks, the coil spring 144 of each brush backs up against the enclosing cap 140 formed by the connectors 136 and 138 and under compression will bias the shank portion toward the open end of the brush opening. It will be appreciated that the overall length of each brush is somewhat greater than the depth of the brush openings so that, even when the spring is partially compressed, the shank portion of the brush protrudes beyond the open end of the insulating block.

Figure 4:
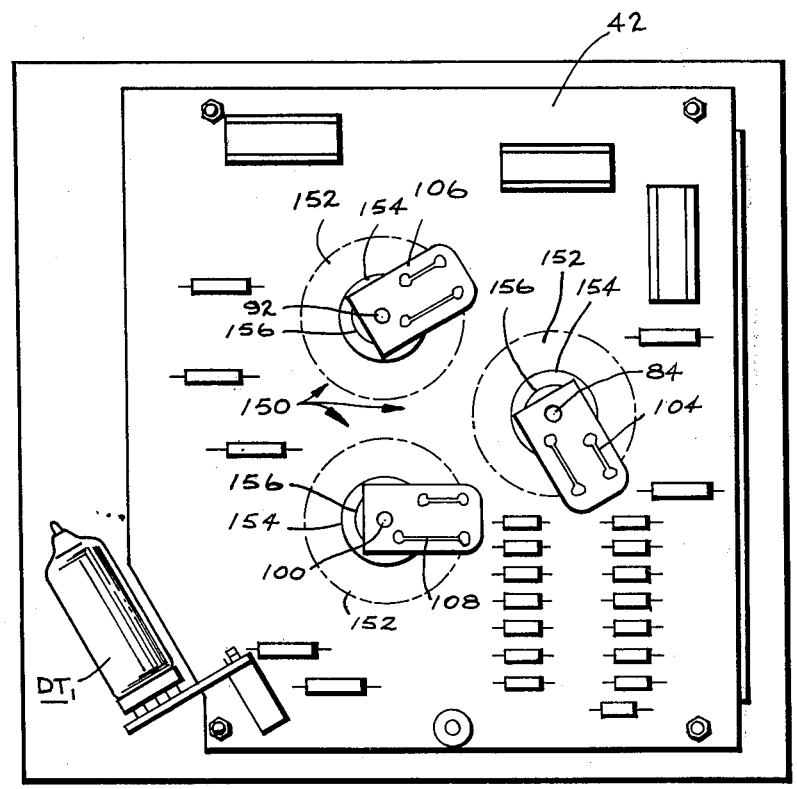
FIG. 4 is a diagrammatic side elevation of the encoder of FIG. 1 showing the brush-type pick-up heads.

When the switch heads are mounted on the ends of the third, fourth, and fifth drive shafts so as to be slightly spaced from the outside face of the first circuit board 42, the square end of the shank portion 142 of the brushes will be urged into positive engagement with printed circuitry (generally designated 150 in FIG. 4) on the first circuit board. It will be appreciated that, since both the shank of the brushes and the lining in the brush openings are square, the brushes are prevented from rotating so that they will wear evenly. It will also be appreciated that as the end of the brush wears down the coil spring will assure that the then shortened shank portion remains in positive contact with the associated printed circuit 150. It will be observed in FIG. 4 that the leading and lagging brushes are disposed to advance across an interrupted circular printed circuit 152 with the interrupted portions of the circuit corresponding to a discrete decimal digit to be displayed by the associated display tube. Each of the grounding brushes is disposed to contact one of two continuous printed circuit rings 154 and 156 which are alternately connected to ground by conventional circuitry for a purpose to be described later.

Now with reference to the photoelectric encoder system it can be seen in FIG. 11 to include a bank of photoelectric lamps 200, 202, and 204 embedded in a mounting block 300 which is attached to the base plate 26 of the encoder. The lamps are arranged to pass light beams through the transparent segments T of the code disc 62. A substantially pie-shaped portion of the code disc passes in front of the lamps so as to be between the lamps and a corresponding bank of photocells (not shown) mounted in a block 164 attached in spaced relation to the mounting block 162 for the lamps. The photocells are electrically connected, as will be explained later, to a logic circuit for converting the electrical signals generated by the photo cells into a binary code and subsequently into a decimal readout for visual display whereby the rotational position of the code disc and consequently the input pinion gear is given a discrete decimal value.

As point out hereinbefore, the code disc 62 has eight radially spaced circular tracks A through H of interrupted transparent openings T through which the light beams can pass. The code disc produces a binary output in that it either admits or interrupts the passage of a light beam whereby each photocell output can assume only two meaningful states, on and off, which is representative either of a binary one or a binary zero. In the preferred form, the outer four tracks A through D are coded in the excess three cyclic binary coded decimal code (XS3 cyclic BCD) (Table I below) whereby the output from these four tracks can be converted by the aforementioned logic circuit into a digital decimal output to the display tube $DT_1$ for the first, or least significant, digit. In turn, the inner four tracks E through H are in a binary coded decimal code (Table II below) and the output from these four tracks is fed into the aforementioned logic circuit to produce a digital decimal output in the display tube $DT_2$ for the second digit. The purpose of the two distinct binary codes in the first and second digits will become apparent later.

| Decimal | TABLE I<br>XS3 Cyclic BCD | TABLE II<br>BCD |
|---------|---------------------------|-----------------|
| 0 | 0010 | 0000 |
| 1 | 0110 | 0001 |
| 2 | 0111 | 0010 |
| 3 | 0101 | 0011 |
| 4 | 0100 | 0100 |
| 5 | 1100 | 0101 |
| 6 | 1101 | 0110 |
| 7 | 1111 | 0111 |
| 8 | 1110 | 1000 |
| 9 | 1010 | 1001 |

The three brush-type contact switches on the third, fourth and fifth drive shafts are arranged to transmit direct decimal readouts to the third, fourth and fifth digit display tubes $DT_3$, $DT_4$ and $DT_5$ without the use of a binary code. This is effected through the printed circuits 150 on the first circuit board 42 with which the brushes on the three switch heads make contact. The third digit switch head 104 on the third drive shaft is connected through its associated printed circuit 150 on the first circuit board to the third digit display tube $DT_3$, the fourth digit switch head 106 on the fourth drive shaft is connected through its associated printed circuit 150 on the first circuit board to the fourth display tube $DT_4$, and the fifth digit switch head 108 is connected through its associated printed circuit 150 on the first circuit board to the fifth digit display tube $DT_5$. With this arrangement each switch head in passing through 360° causes the decimal digits 0–9 to be displayed once by the associated display tube. As pointed out before, however, the switcch heads rotate at different speeds with the third digit switch head 104 making ten revolutions for every one revolution of the fourth digit switch head 106, and the fourth digit switch head making ten revolutions for every one revolution of the fifth digit switch head 108.

Referring back to the photoelectric encoder portion, the code disc 62 is divided into two hundred discrete counts per one revolution with the least significant digit passing from zero to nine twenty times and the second digit passing from zero to nine two times per revolution of the code disc. Due to the speed reduction from the encoder gear train, the third digit switch head 104 makes one-tenth of a revolution for every one-half revolution of the code disc 62 and, with the fourth and fifth digit switch heads making the proportionate revolutions set forth hereinbefore, an accurate five-digit decimal readout is effected through cooperation of the photoelectric encoder system and the brush-type encoder system so that the readout number corresponds to the angular position of the input pinion gear 22 and consequently the linear position of the encoder with relation to the rack 24 with which the pinion gear meshes.

The encoder is provided with a unique mechanical clutch arrangement 160 which enables one to set the encoder at a desired reference number with the machine tool and the work object in preselected relative positions. For example, it may be desired to have a "zero" reference setting at some designated distance from the starting point of movement of the machine tool. With the clutch arrangement of the present encoder, the encoder can be zeroed by moving the machine tool or work table until the encoder reads 00.000, and then disengaging the clutch so that the machine tool or work table can be moved to the new reference point without affecting the readout of the encoder before again engaging the clutch and thereby recording movement of the machine tool relative to the work table.

The clutch includes a rotatable clutch shaft 162, a clutch plate 164, a pivot post 166 secured to the base plate 26, and a cotter pin 168 acting as a pivot pin passing through the clutch plate and the pivot post in a manner such that the clutch plate can reciprocally pivot, between the solid and dotted line positions of FIG. 9, in one plane about the cotter pin. The clutch shaft 162 successively passes through openings in the first circuit board 42, the second and first mounting plates 38 and 34, respectively, the clutch plate 164, and is subsequently received in a blind hole in the base plate 26. The clutch shaft 162 is rotatably received in the blind hole and is held therein by an collar 170 which is secured to the clutch shaft and abuts against the inner side of the first mounting plate 34. A coil spring 172 concentrically mounted on the clutch shaft between the base plate and the clutch plate 164 urges the associated end of the clutch plate outwardly away from the base plate. A retainer pin 174 (FIG. 8) passing radially through the clutch shaft adjacent the outermost side of the clutch plate prevents the clutch plate from moving outwardly beyond a preselected position on the clutch shaft. The clutch plate has a concave recessed surface or shallow depression 176 around the opening through which the clutch shaft passes. The recessed surface 176 is designed so that when the clutch shaft and consequently the pin through the shaft are pivoted in one direction by an operator manually turning a knob 178 fixed to the end of the clutch shaft, the concave surface 178 which engages the retainer pin 174 will cause the retainer pin to ride up from the bottom of the recessed surface toward the flattened outside surface of the clutch plate and thereby force the associated end of the control plate to be moved inwardly toward the base plate into the solid line position of FIG. 9. An opposite pivotal movement of the clutch shaft causes the pin to drop back into the bottom of the concave recess so that the associated end of the clutch plate is allowed to move back away from the base plate to the dotted line position of FIG. 9 under the urging of the concentric coil spring 172.

The clutch plate 164 consists of a flattened bar 182 having a bifurcated end 184 opposite to the end in which the concave recess is located. Between the concave recess and the bifurcated end, the clutch plate is provided with an elongated slot 186 passing through the thin dimension of the bar, the slot having a minor diameter equal to the diameter of the pivot post and a major diameter which is larger than the pivot post to allow the clutch plate to pivot back and forth in one direction on the pivot post. The cotter pin 168 passes through an opening extending through the thicker dimension of the clutch plate 164 and through an aligned opening in the pivot post (not shown) so that the clutch plate is allowed to pivot in one direction, between the solid and dotted lines of FIG. 9, about the cotter pin with the pivot post preventing any other direction of pivotal movement. The bifurcated end 184 of the control plate defines two fingers 186 which protrude onto diametrically opposed sides of the second drive shaft 64. Each of the fingers has an abutment head 188 which is adapted to engage the inner face of the code disc 62 when the clutch is disengaged. Thus, it will be seen that when the clutch shaft is rotated or pivoted causing the radial pin 174 to be cammed by the recessed surface 176 of the clutch plate so that the associated end of the clutch plate is forced toward the base plate into the solid line position of FIG. 9, the clutch plate will pivot about the cotter pin causing the abutment heads 188 on the bifurcated end of the clutch plate to move outwardly against the inner face of the code disc. The outward pressure exerted on the code disc causes it to slide a short distance in an axial direction along the second drive shaft until the disc is disengaged from the cork friction plate 60 on the drive plate 58. When the clutch is disengaged, rotational movement of the pinion gear 22 will cause the friction plate 60 to rotate freely on the second drive shaft 64 independently of the code disc and consequently the remainder of the gear train 48. It is also important to note that the engagement of the abutment heads with the code disc is operative to brake the code disc and positively prevent it from moving when the clutch is disengaged. The coil spring 74 on the second drive shaft is compressed by the outward axial movement of the code disc and thus biases the disc in an inward axial direction toward the base plate 20 so that, when the clutch is next engaged by an opposite pivotal movement of the clutch shaft, the code disc will be moved axially back into frictional engagement with the friction plate 60.

A principal problem encountered with analog-to-digital converters or encoders is to establish a distinct set of unambiguous signals for each change in analog signal or shaft position. Ambiguity problems arise from practical considerations with regard to the alignment tolerances of the encoding and sensing elements; and in encoders of the type wherein both photoelectric and brush-type sensors are used, ambiguities may arise in one of several ways: In the case of the photoelectric sensors, the ambiguities may be introduced to the encoder when adjacent binary numbers differ by more than one binary bit or character and these binary numbers are not simultaneously changed in response to the pinion gear position changes. In the case of the brush sensors which engage an interrupted track having the interrupted segments associated with a particular decimal digit, space limitations on the printed circuit board when taken in consideration with the physical size of the brushes make it difficult to space the interrupted segments so that a brush does not contact two segments at the same time, thereby creating an ambiguous signal.

In the present encoder the ambiguity problems arising in the photoelectric portion are dealt with in a different manner than those arising in the brush-contact portion because the brush contact generated readout digits do not pass through a binary code as do the photoelectric generated readout digits. The first two digits, which are controlled by the photoelectric encoder, are susceptible to an ambiguous signal at the point in which the pinion gear position sensed by the code disc passes between the successive binary signals. The problem of ambiguous signals in the photoelectric portion can be solved by using a "cyclic" binary code wherein adjacent binary numbers never differ by more than one binary bit. In the present invention, a cyclic excess 3 BCD code (Table I) is utilized for the least significant or first digit. That is, the outer four tracks on the code disc 62 are coded in the cyclic excess 3 BCD code so that successive numbers in the binary output from the outer four tracks of the code disc will never differ by more than one bit.

The second digit is made unambiguous by utilizing leading and lagging lamps 200 and 202 respectively (Figure 11) and photocells (not shown) for each of the inner four tracks E, F, G and H of the code disc, and selectively energizing one or the other of the leading and lagging photocell outputs with a selector circuit that is responsive to a signal from the binary output of the single photoelectric sensors associated with the first digit. In this manner, the leading or lagging photocells associated with each one of the inner four tracks can be simultaneously energized to effect an unambiguous signal. The photocell pair arrangements of the present invention are in the form of a U-scan technique whereby the pairs of photocells 200 and 202 associated with the second digit and thus the inner four tracks are arranged in advanced and retarded relationship with respect to photocells 204 for the first digit or outer four tracks on the code disc. In the U-scan technique, the parity of the first digit sensing photocells selects a set of second digit photocells, either the leading or lagging photocells, in a manner such that no ambiguity arises as the pairs of photocells pass from one binary number to the next. That is, at some point during which the leading and lagging photocells associated with one track are aligned with a first substantially pie-shaped increment of the code disc corresponding to a particular digit, the leading photocell 200 is deenergized and the lagging photocell 202 energized so that, when the first increment begins to pass beyond the leading photocell 200 but while the lagging photocell 202 is still aligned with the first increment, the output from the pair of photocells as a unit will not have changed but will remain as a discrete output associated with the coded information in the first increment of the code disc. Before the first increment begins to pass beyond the lagging photocell but after the leading photocell has become aligned with the next adjacent second increment on the code disc, the leading photocell is energized and the lagging photocell deenergized so that a new discrete output from the pair of photocells will be associated with the second increment. In this manner a photocell is never conducting as the junctures of adjacent increments on the code disc pass thereacross so that an ambiguous signal is always prevented.

Figure 13:
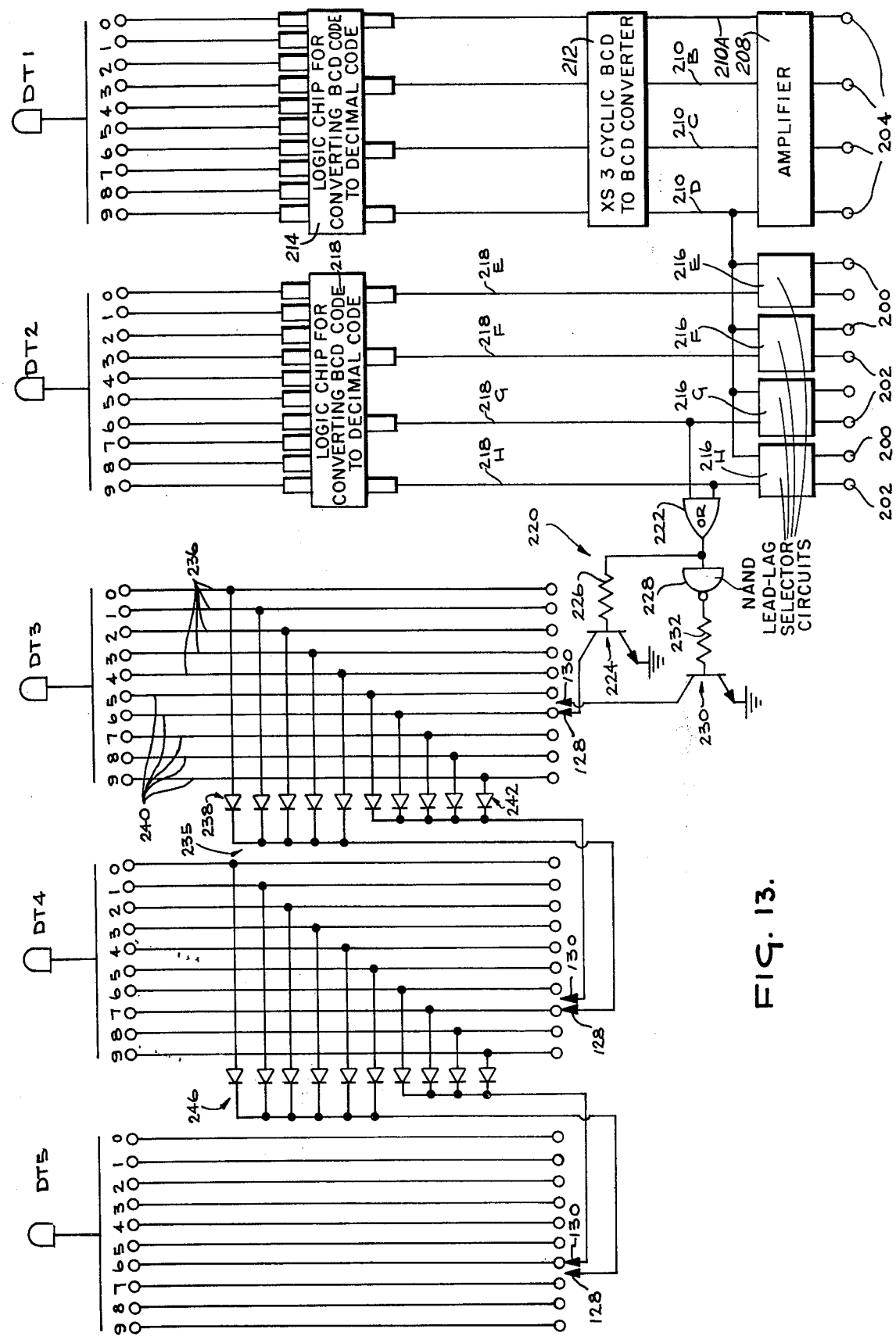
FIG. 13 is a schematic diagram of the control circuit for the encoder of FIG. 1.

Referring now to the schematic diagram in FIG. 13, it can be seen that the four photocells 204 associated with the first digit and thus the four outside tracks on the code disc herein designated A, B, C and D, with A being the outermost track, are each connected by an electrical line to an amplifier 208 which may be in the form of a bank of transistors, one associated with each of the four photocells 204. The output from each transistor amplifier associated with the respective photocells 204 is fed through conductive lines $210_A$-$210_D$ into a conventional converter logic circuit 212 wherein the cyclic excess 3 BCD code is converted into a binary coded decimal (BCD) code. The outputs from the cyclic BCD converter are fed into a commercially available logic chip 214 which converts the BCD code into a decimal output that is received by the first digit display tube $DT_1$ to display a visual decimal readout.

An electrical connection is made between the line $210_D$ of the first digit photocells as it leaves the amplifier and a bank of lead-lag selector circuits $216_E$-$216_H$ which are electrically connected to respective pairs of photocells 200 and 202 associated with the second digit. The lead-lag selector circuits are effective to selectively energize one or the other of the leading and lagging photocells. When the selector circuits are energized by a current in the D track line $210_D$ of the first digit photocells, the lagging photocells 202 are energized and, alternately, when there is no current in the D track line $210_D$, the lead-lag selector circuits are not energized, and the leading photocells 200 associated with the second digit are energized and the lagging photocells 202 deenergized. It will thus be apparent that, as the first digit passes from four to five (see Table I) which would leave the photocells for the second digit approximately aligned with the center of an increment of the code disc, since the first digit passes through ten numbers in the same time the second digit passes through one number, the lead-lag selector circuits of the second digit are energized whereby the leading photocells 200 are simultaneously deenergized and the lagging photocells 202 simultaneously energized. It also follows that as the first digit passes from nine to zero (see Table I), the lead-lag selector circuits are deenergized, rendering the lagging photocells 202 non-conductive and the leading photocells 200 conductive. In this manner, as the binary numbers associated with the second digit pass between successive numbers, a positive unambiguous signal, as discussed hereinbefore, will be transmitted through electrical lines $218_E$-$218_H$ to a logic chip 218, identical to the logic chip 214 associated with the first digit, wherein a BCD input is converted into a decimal output which is displayed by the second digit display tube $DT_2$.

As mentioned earlier, the second digit is in a BCD code (see Table II) with the associated four tracks E, F, G and H representing decimal numbers of $2^0$, $2^1$, $2^2$ $2^3$, respectively. A selector logic circuit 220 interconnects the second digit BCD signals to the third digit as can be evidenced in FIG. 13. As pointed out earlier, the third digit is generated by a brush switch, as opposed to a photoelectric switch, and to remove any ambiguity in the third digit when changing from one number to the next, the brush switch is provided with two brushes, a leading brush 128 and a lagging brush 130 (see FIG. 5). The leading and lagging brushes are alternately energized and deenergized according to the decimal value of the second digit by the selector logic circuit 220, which insures that only one brush will be energized at any given time. The selector logic circuit includes an OR gate 222 with one input connected to the line $218_G$ of the second digit and the other input connected to line $218_H$ of the second digit whereby, when the photocells associated with either the G or H track are conducting, an output through the OR gate 222 will be generated. The output from the OR gate 222 is fed into an inverter circuit which is also included in the selector logic circuit 220. The inverter circuit includes two conducting lines each of which is connected to the output of the OR gate 222. The first line has a transistor 224 which functions to invert the signal it receives through a current limiting resistor 226 whereby a positive voltage on the base of the transistor 224 places a zero voltage or ground on the collector of the transistor which is electrically connected to the leading brush 128 for the third digit. The second line from the output of the OR gate passes through a NAND gate 228 which inverts the signal it receives before it is passed into a second transistor 230 through a current limiting resistor 232 which again inverts the signal and passes it to the lagging brush 130 for the third digit. Therefore, the signal received by the lagging brush 130 corresponds to the output of the OR gate 222 which is opposite to that received by the leading third digit brush 128. In this manner as the second digit passes from 3 to 4, i.e., $2^0 + 2^1$ to $2^2$, thus creating a current in line $218_G$, the lagging brush for the third digit is energized and the leading brush is deenergized. The leading and lagging brushes remain in this state until the second digit passes from nine to zero, i.e. $2^3 + 2^0$ to 0, thereby stopping the current flow in both the lines $218_G$ and $218_H$ so that the leading brush for the third digit is energized and the lagging brush is deenergized. Through this logic circuit, ambiguity in the third digit is removed because the brush passing between increments on the associated printed circuit is never conducting; only the brush that is within an increment (which represents a decimal number) of the printed circuit conducts so that a positive unambiguous signal is always produced as the brushes as a pair pass from one decimal contact of the printed circuit to the next.

The electrical lines for the third digit connecting the brush contact terminals of the third digit to the associated terminals on the third digit display tube are connected in a predetermined manner forming a selector circuit 235 to the leading and lagging brushes for the fourth digit switch. Specifically, the electrical lines 236 associated with the numbers zero through 4 of the third digit are connected through a bank of diodes 238 to the lagging brush 130 of the fourth digit, and the electrical lines 240 associated with the numbers 5 through 9 of the third digit are connected through a separate bank of diodes 242 to the leading brush 128 of the fourth digit. Accordingly, when the third digit reads zero through 4, the lagging brush for the fourth digit is energized and when the third digit reads 5 through 9 the leading brush for the fourth digit is energized. In this manner, all ambiguity is removed in the fourth digit by having a positive unambiguous signal transmitted to the fourth digit display tube as the pair of brushes associated with the fourth digit pass from one decimal to the next.

A selector circuit 246 interconnecting the fourth digit and the fifth digit is identical to the selector circuit 235 connecting the third digit to the fourth digit so that a description thereof is deemed unnecessary.

It is understood that various modifications and changes in the construction and arrangement of parts and elements comprising the preferred form of the present invention may be resorted to without departing from the spirit of the present invention.

I claim:
1. Electrical contact apparatus comprising:
first and second circular conductor strips,
a plurality of electrical contacts arranged sequentially in at least a portion of a circle,
a brush holder including a mounting block composed of an insulating material,
drive means for rotating said mounting block at a predetermined rate of speed,
first and second pairs of brush holder means disposed in said mounting block, each pair of brush holder means including a pair of passages arranged in spaced parallel relation to one another and to the axis of rotation of said mounting block, each passage having an electrically conductive lining of non-circular cross-section therein,
first and second pairs of leading and lagging brush sensor members, each brush sensor member having an elongated shank portion of non-circular cross-section disposed for non-rotative, but lengthwise slidable movement within a lining in one of said passages, resilient means within each passage yieldably urging one end face of said shank portion in a lengthwise direction out of its passage parallel to the axis of rotation of said mounting block, said first and second pairs of brush sensor members having one said end face in sliding electrical communication with a respective one of said first and second conductor strips, the other said end face of said first and second pairs of brush sensor members being arranged for sliding movement over said plurality of contacts,
electrical connecting means electrically interconnecting each of said leading sensor brush members together and each of said lagging brush members together, and switching means coupled to said strips and said contacts for completing an electrical circuit therewith through the one of said pair of brush sensor members which is in established electrical communication with one of said contacts and for disabling an electrical circuit for the one of said pairs of brush sensor members which is in rotational transition between said contacts.

2. Electrical contact apparatus according to claim 1, the shank portion of each brush member having a reduced end portion adapted for receiving said resilient means whereby said resilient means and said shank portion behave as a unitary electrical contact element, said resilient means being in electrical contact with said electrical connection means.

3. Electrical contact apparatus according to claim 1, said shank portion and said lining of each brush member having correspondingly square cross-sections, and said switching means including a pair of switch devices each capable of responding to the presence of a control signal thereto for effecting electrical conduction therethrough, said switch devices being connected in series circuit relation with respective said conductor strips, and selector circuit means responsive to the rotational orientation of said brush holder with respect to said plurality of electrical contacts for providing a said control signal to one of said switch devices.

4. Electrical contact apparatus according to claim 1, said electrical connection means also serving as abutment means operatively attached to said mounting block and bearing against the free end of said resilient portion whereby said shank portion is biased in an axial direction away from said connector means in a direction parallel to the axis of rotation of said mounting block.

5. Electrical contact apparatus according to claim 4, said mounting block presenting a substantially flat surface through which each of said passages extend, and said shank portions each provided with an external end portion of square cross-section protruding outwardly from the flat surface of said mounting block.

* * * * *